United States Patent
Bedell et al.

(10) Patent No.: US 10,580,925 B2
(45) Date of Patent: Mar. 3, 2020

(54) HIGH VOLTAGE PHOTOVOLTAICS INTEGRATED WITH LIGHT EMITTING DIODE CONTAINING ZINC OXIDE CONTAINING LAYER

(71) Applicant: INTERNATIONAL BUSINESS MACHINES CORPORATION, Armonk, NY (US)

(72) Inventors: Stephen W. Bedell, Wappingers Falls, NY (US); Ning Li, White Plains, NY (US); Devendra K. Sadana, Pleasantville, NY (US); Ghavam G. Shahidi, Pound Ridge, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/250,109

(22) Filed: Jan. 17, 2019

(65) Prior Publication Data

US 2019/0148581 A1 May 16, 2019

Related U.S. Application Data

(63) Continuation of application No. 15/831,844, filed on Dec. 5, 2017, now Pat. No. 10,249,783, which is a
(Continued)

(51) Int. Cl.
*H01L 31/153* (2006.01)
*H01L 31/0735* (2012.01)
(Continued)

(52) U.S. Cl.
CPC .......... *H01L 31/153* (2013.01); *H01L 25/167* (2013.01); *H01L 31/02008* (2013.01);
(Continued)

(58) Field of Classification Search
CPC . H01L 33/0025; H01L 33/0075; H01L 33/06; H01L 33/32; H01L 31/153; H01L 31/035236; H01L 31/0735; H01L 31/1856
See application file for complete search history.

(56) References Cited

U.S. PATENT DOCUMENTS 7,277,463 B2 * 10/2007 Guenter ................ H01S 5/0425
257/E27.12
9,136,258 B1 * 9/2015 Wang .................... H01L 31/173
(Continued)

OTHER PUBLICATIONS

List of IBM Patents or Patent Applications Treated as Related dated Jan. 17, 2019, 2 pages.

*Primary Examiner* — Mark W Tornow
(74) *Attorney, Agent, or Firm* — Tutunjian & Bitetto, P.C.; Erik Johnson

(57) ABSTRACT

An electrical device that includes a material stack present on a supporting substrate. An LED is present in a first end of the material stack having a first set of bandgap materials. A photovoltaic device is present in a second end of the material stack having a second set of bandgap materials. The first end of the material stack being a light receiving end, wherein a widest bandgap material for the first set of bandgap material is greater than a highest bandgap material for the second set of bandgap materials. A zinc oxide interface layer is present between the LED and the photovoltaic device. The zinc oxide layers or can also form a LED.

20 Claims, 7 Drawing Sheets

Related U.S. Application Data continuation of application No. 15/468,759, filed on Mar. 24, 2017, now Pat. No. 10,249,782.

(51) Int. Cl.
    *H01L 31/18*     (2006.01)
    *H01L 33/00*     (2010.01)
    *H01L 31/0352*     (2006.01)
    *H01L 33/32*     (2010.01)
    *H01L 33/06*     (2010.01)
    *H01L 25/16*     (2006.01)
    *H01L 31/02*     (2006.01)
    *H01L 31/147*     (2006.01)
    *H01L 33/42*     (2010.01)

(52) U.S. Cl.
    CPC .. *H01L 31/035236* (2013.01); *H01L 31/0735* (2013.01); *H01L 31/147* (2013.01); *H01L 31/1856* (2013.01); *H01L 33/007* (2013.01); *H01L 33/0025* (2013.01); *H01L 33/0075* (2013.01); *H01L 33/06* (2013.01); *H01L 33/32* (2013.01); *H01L 33/42* (2013.01); *Y02E 10/544* (2013.01); *Y02P 70/521* (2015.11)

(56) References Cited

U.S. PATENT DOCUMENTS

| | | |
|---|---|---|
| 9,768,329 B1 | 9/2017 | Kayes et al. |
| 9,985,164 B1 * | 5/2018 | Bedell ............... H01L 31/03529 |
| 9,991,408 B1 * | 6/2018 | Bedell ............... H01L 31/03529 |
| 2010/0032008 A1 | 2/2010 | Adekore |
| 2018/0248134 A1 | 8/2018 | Irwin et al. |

\* cited by examiner

US 10,580,925 B2

HIGH VOLTAGE PHOTOVOLTAICS INTEGRATED WITH LIGHT EMITTING DIODE CONTAINING ZINC OXIDE CONTAINING LAYER

BACKGROUND

Technical Field

The present invention generally relates to photovoltaic devices, and more particularly to photovoltaic devices used to power light emitting diodes.

Description of the Related Art

A photovoltaic device is a device that converts the energy of incident photons to electromotive force (e.m.f.). Typical photovoltaic devices include solar cells, which are configured to convert the energy in the electromagnetic radiation from the sun to electric energy. A light-emitting diode (LED) is a two-lead semiconductor light source. It is a p-n junction diode, which emits light when activated. When a suitable voltage is applied to the leads to the LED, electrons are able to recombine with electron holes within the device, releasing energy in the form of photons. This effect is called electroluminescence, and the color of the light (corresponding to the energy of the photon) is determined by the energy band gap of the semiconductor.

SUMMARY

In accordance with one embodiment, an electrical device is described herein that includes a photovoltaic structure in combination with a light emitting diode (LED) structure, wherein the photovoltaic structure provides the power to the LED. In one embodiment, a material stack is provided that includes an LED device at a first end of the material stack and a photovoltaic device at a second end of the material stack. The LED at the first end of the material stack has a first set of bandgap materials; and the photovoltaic device at the second end of the material stack has a second set of bandgap materials. The second end of the material stack being a light receiving end for the device. In some embodiments, a width of the bandgap material for the second set of bandgap material is greater than a width of a bandgap material for the first set of bandgap materials. The interface between the LED and the photovoltaic device is provided by a zinc oxide interface layer.

In another embodiment, an electrical device is provided that includes a material stack is having a photovoltaic device at a first end of the material stack and an LED at a second end of the material stack. The LED has a second set of bandgap materials, and the photovoltaic device has a first set of bandgap materials. The second end of the material stack being the light receiving end of the device. The bandgap for the second set of bandgap material is greater than the highest bandgap material for the first set of bandgap materials. The interface between the LED and the photovoltaic device is provided by a zinc oxide interface layer.

In another aspect, a method of forming an electrical device is described herein that in one embodiment includes providing a material stack including an LED portion and a photovoltaic portion with a zinc oxide interface layer present therebetween. The LED portion is comprised of semiconductor material layers having a first set of bandgaps. The photovoltaic portion is comprised of semiconductor material layers having a second set of bandgaps. The LED portion of the material stack is at a first end of the material stack and the photovoltaic portion is present at a second end of the material stack, wherein the device having the first or second set of bandgaps having the wider band gap is positioned at the light end receiving end of the material stack.

In one embodiment, the method of forming the electrical device may include growing a first junction on a supporting substrate; forming a zinc oxide interface layer on the first junction and forming a second junction on the zinc oxide interface layer. In some embodiments, the first junction may be formed by molecular beam epitaxial (MBE) growth. Contact may then be formed to the first junction and the second junction, wherein a first device of one of the first and the second junction is a photovoltaic device, and a second device of a second of the first and the second junction is a light emitting diode. The semiconductor material layers in the LED or the photovoltaic device that is at a light receiving end of the electrical device have a wider band gap than the semiconductor material layers at the LED or the photovoltaic device that is not at the light receiving end of the electrical device. In one embodiment, ZnO LED or ZnO/GaN heterojunction LED is used in the device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
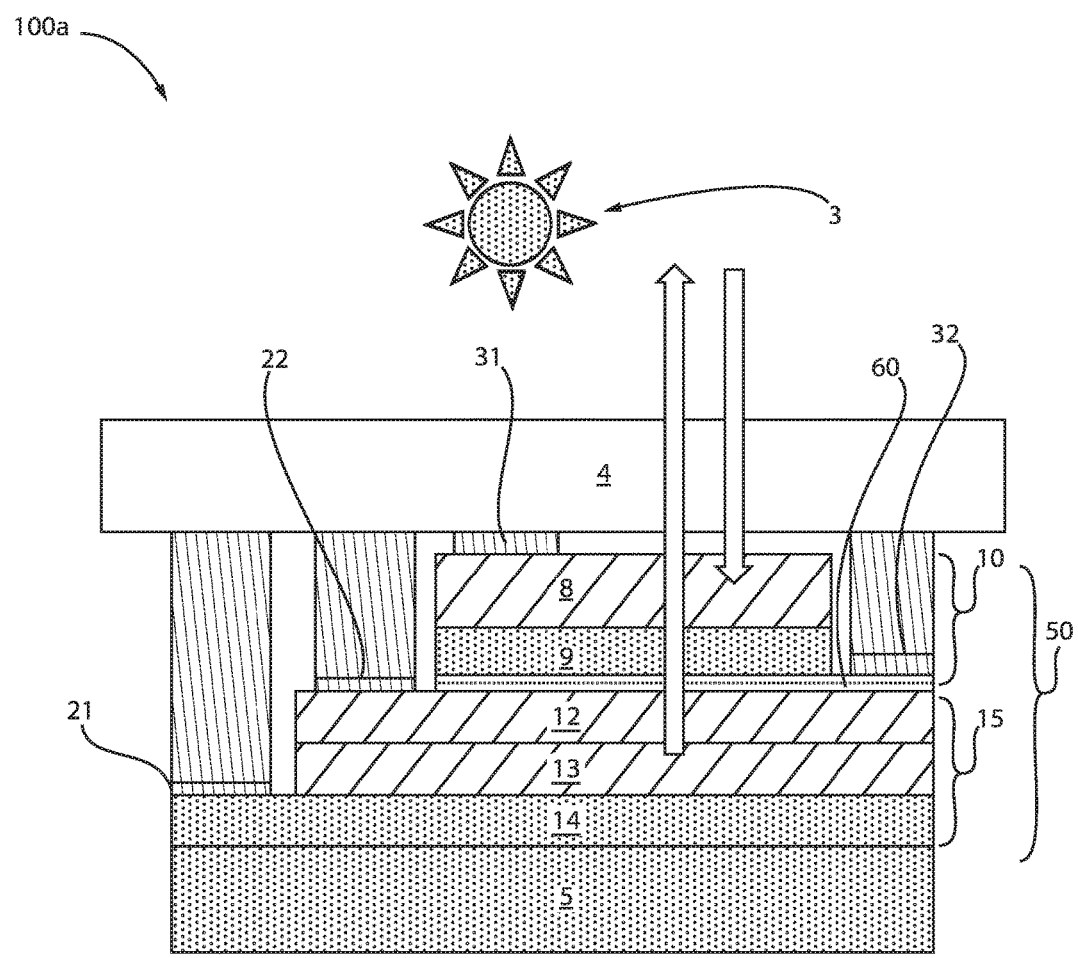
FIG. 1 is a side cross-sectional view depicting one embodiment of a high voltage photovoltaic cell including gallium nitride (GaN) that is integrated with a light emitting diode (LED), in which the LED is positioned between the supporting substrate and the photovoltaic device, and a zinc oxide interface layer is present between the LED and the photovoltaic device.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one embodiment, the present disclosure provides photovoltaic cells, i.e., photovoltaic devices, needed for internet of things (IOT) applications that also include light emitting diodes (LEDs), in which a zinc oxide interface layer is present between the photovoltaic. As used herein, a "photovoltaic device" is a device, such as a solar cell, that produces free electrons and/or vacancies, i.e., holes, when exposed to radiation, such as light, and results in the production of an electric current. A multi-junction photovoltaic device typically includes a multiple junctions of a semiconductor layer of a p-type conductivity that shares an interface with a semiconductor layer of an n-type conductivity, in which the interface provides an electrical junction. As used herein, the term "LED" denotes a semiconductor material containing structure that emits light when an electrical current is passed through it. In some embodiments, the light-emitting diode (LED) is a two-lead semiconductor light source, which can resemble a pn-junction diode. In this example, when a voltage is applied to the leads to the pn-junction type diode, electrons are able to recombine with electron holes within the device, releasing energy in the form of photons. This effect is called electroluminescence, and the color of the light (corresponding to the energy of the photon) is determined by the energy band gap of the semiconductor.

Physically small, i.e., devices having a small footprint, having high voltage requirements are needed. The length and width dimensions of the monolithically formed devices of high voltage photovoltaics integrated with LED that are described herein may be no greater than 150 microns, e.g, may be equal to 100 microns or less.

In some embodiments, the voltage requirements can be met by a multi-junction photovoltaic cells, as depicted in FIG. 1. The voltage requirements for a photovoltaic device of this type may require between 2 volts and 3 volts to drive light emitting diodes (LEDs) for communication applications. The voltage requirements to write and read memory cells may range from 2 volts to 3.5 volts. In battery applications, the photovoltaic devices may need to provide 3.5 volts to charge a battery.

In some embodiments, an integrated LED is needed to send signal to outside the device. Monolithically integrated LEDs with photovoltaic devices can reduce size of an electrical device that typically includes an LED that is separate from a photovoltaic device or other power source. In some embodiments, the structures and methods disclosed herein provide a high voltage photovoltaic device that is integrated with an LED that may be used for energy harvesting and communication, in which the integrated device is formed using semiconductor growth processes, which may include growth processes using low hydrogen content precursors.

A zinc oxide interface layer is present at the interface between the photovoltaic device and the LED. The zinc oxide interface may be crystalline in nature and can provide for increased crystallinity of the device, e.g., LED or photovoltaic device, that is being formed thereon. The zinc oxide interface is also electrically conductive therefore reducing the resistance at the interface of the LED and the photovoltaic device. Further, the zinc oxide interface may function as a cap material obstructing the diffusion of elements, such as hydrogen, into the underlying semiconductor material layer, such as gallium including semiconductor layers, e.g., gallium nitride, aluminum gallium nitride, indium aluminum gallium nitride and combinations thereof. In some embodiments, the zinc oxide interface may be aluminum zinc oxide (AlZnO), which may be referred to as AZO.

The photovoltaic device 100a depicted in FIG. 1 may be composed of a material stack 50 including a LED 15 and a photovoltaic device 10 that is present on a supporting substrate 5, wherein a zinc oxide interface layer 60 is present at the interface of the LED 15 and the photovoltaic device 10.

The LED device 15 may be present at a first end of the material stack having a first set of bandgap materials 12, 13, 14; and the photovoltaic device at a second end of the material stack having a second set of bandgap materials 8, 9. A band gap, also called an energy gap or bandgap, is an energy range in a solid where no electron states can exist. In graphs of the electronic band structure of solids, the band gap generally refers to the energy difference (in electron volts) between the top of the valence band and the bottom of the conduction band in insulators and semiconductors. It is the energy required to promote a valence electron bound to an atom to become a conduction electron, which is free to move within the crystal lattice and serve as a charge carrier to conduct electric current.

In some embodiments, because the LED device 15, the zinc oxide interface layer 60, and the photovoltaic device 10 are included within the same material stack 50, the devices 10, 15 are monolithographically integrated onto the same substrate 5.

In each of the combinations of electrical devices described herein, the material layers for the photovoltaic device 10 are selected to produce enough power to cause the LED 15 to emit light. In the embodiments in which the photovoltaic device 10 is present atop the LED 15, and the LED 15 emits light in the direction through the photovoltaic device 10, the bandgap materials of the photovoltaic device 10 and the LED device 15 are selected so that the wavelengths of light emitted by the LED 15 are not absorbed by the photovoltaic device 10.

In each of the electrical devices described herein, including a photovoltaic device 10, the zinc oxide interface layer 60 and an LED 15 integrated within the same material stack 50, the bandgaps of the materials are selected so that the device composed of the wider bandgap materials, e.g., LED device 15 or photovoltaic device 10, is present at the top of the device, i.e., the light receiving end of the device; and that the device composed of the narrower bandgap materials, e.g., LED device 15 or the photovoltaic device 10, is present at the base of the device, i.e., the end of the device that is furthest from the light source.

Referring to FIG. 1, the photovoltaic device 10 is positioned at the end of the material stack 50 at which at the light (identified by reference number 3) first enters the device, which is the light receiving end of the device. In the embodiment depicted in FIG. 1, the photovoltaic device 10 is present at the light receiving end of the material stack 50 and is composed of a p-type conductivity gallium and nitride containing layer 8, i.e., p-type gallium nitride (GaN), that forms a junction by direct contact to an n-type conductivity gallium and nitride containing layer 9, i.e., n-type gallium nitride (GaN). The band gap for gallium nitride (GaN) is on the order of 3.4 eV. The photovoltaic device 10 that is depicted in FIG. 1 when receiving a light wavelength ranging from 250 nm to 350 nm can provide a voltage that is greater than 2.0 eV. In yet other examples, the voltage produced by the photovoltaic device is greater than 2.25 eV. For example, the photovoltaic device 10 that includes the junction of the n-type gallium nitride (GaN) layer and the p-type gallium nitride (GaN) layer that is depicted in FIG. 1 may produce a voltage of 2.5 V or greater. It is noted that the above examples are provided for illustrative purposes only, and are not intended to limit the present disclosure. In other examples, the voltage produced by the photovoltaic device 10 composed of the n-type and p-type conductivity gallium nitride (GaN) layers depicted in FIG. 1 may be equal to 2.0 V, 2.25 V, 2.5 V, 2.75 V, 3.0 V, 3.25 V, and 3.5V, as well as any value between the aforementioned examples, and any range of voltages having a lower limit provided by one of the aforementioned example voltages, and an upper limit provided by one of the aforementioned example voltages.

Each of the p-type conductivity gallium and nitride containing layer 8, e.g., p-type gallium nitride (GaN), and the n-type conductivity gallium and nitride containing layer 9, e.g., n-type gallium nitride (GaN) can have a thickness ranging from 100 nm to 2000 nm.

As used herein, "p-type" refers to the addition of impurities to an intrinsic semiconductor that creates deficiencies of valence electrons. As used herein, "n-type" refers to the addition of impurities that contributes free electrons to an intrinsic semiconductor. In a type III-V semiconductor material, the effect of the dopant atom, i.e., whether it is a p-type or n-type dopant, depends upon the site occupied by the dopant atom on the lattice of the base material. In a III-V semiconductor material, atoms from group II act as acceptors, i.e., p-type, when occupying the site of a group III atom, while atoms in group VI act as donors, i.e., n-type, when they replace atoms from group V. Dopant atoms from group IV, such a silicon (Si), have the property that they can act as acceptors or donor depending on whether they occupy the site of group III or group V atoms respectively. Such impurities are known as amphoteric impurities. The dopant that provides the n-type conductivity for the n-type conductivity gallium and nitride containing layer 9 may be present in a concentration ranging from $10^{17}$ atoms/cm$^3$ to $10^{20}$ atoms/cm$^3$. The dopant that provides the p-type conductivity of the p-type conductivity gallium and nitride containing layer 8 may be present in a concentration ranging from $10^{17}$ atoms/cm$^3$ to $10^{20}$ atoms/cm$^3$.

In some embodiments, the light required to power the photovoltaic device 10 of the p-type conductivity gallium and nitride containing layer 8 and the n-type conductivity gallium and nitride containing layer 9 may range from 250 nm to 350 nm. In another embodiment, the light required to power the photovoltaic device 10 having the junction of the p-type conductivity gallium and nitride containing layer 8 and the n-type conductivity gallium and nitride containing layer 9 is equal to approximately 300 nm.

The p-type conductivity gallium and nitride containing layer 8 and the n-type conductivity gallium and nitride containing layer 9 of the photovoltaic device 10 are a first set of bandgap materials, while the material layers in the LED 15 are a second set of bandgap materials. The minimum bandgap for the first set of bandgap materials, i.e., the minimum bandgap materials for the material layers in the photovoltaic device 10, is wider, i.e., greater, than the minimum bandgap for the second set of bandgap materials, i.e., the minimum bandgap materials for the material layers in the LED device 15.

In the embodiment that is depicted in FIG. 1, the end of the material stack 50 at which the light emitting diode (LED) 15 is positioned is further from the light receiving end of the device than the end of the material stack 50 at which the photovoltaic device 10 is positioned. In the embodiment that is depicted in FIG. 1, the LED 15 is positioned between the supporting substrate 4 and the photovoltaic device 10. The supporting substrate 5 can be composed of n-type gallium nitride. The n-type gallium nitride containing photovoltaic junction layer 9 can be in direct contact with the zinc oxide interface layer 60 that is separating the photovoltaic device 10 from the LED 15.

Referring to FIG. 1, a zinc oxide interface layer 60 is present at the interface between the photovoltaic device 10 and the LED 15. In some examples, the zinc oxide interface layer may further include aluminum (Al). For example, the zinc oxide interface layer may be composed of aluminum zinc oxide (Al:ZnO). The aluminum zinc oxide may be referred to aluminum doped zinc oxide or AZO. It is noted that aluminum is not the only metal dopant that can be employed in the zinc oxide layer 60. Other metal dopants that are suitable for use in the zinc oxide interface layer 60 may include boron (B), gallium (Ga), indium (In), yttria (Y), fluorine (F), vanadium (V), silicon (Si), scandium (Sc), germanium Ge), titanium (Ti), zirconium (Zr), hafnium (Hf) and combinations thereof, as well as combinations with aluminum (Al).

The zinc oxide interface may be crystalline in nature and can provide for increased crystallinity of the device, e.g., LED or photovoltaic device, that is being formed thereon. The zinc oxide interface 60 is also electrically conductive therefore reducing the resistance at the interface of the LED and the photovoltaic device. The electrical conductivity of the aluminum zinc oxide layer may range from 1 Ohm/square to 1 kOhm/square. In one example, the aluminum zinc oxide layer that provides the interface material can have a resistivity on the order of $3.4 \times 10^{-4}$ ohms cm and a transmittance above 85% in the visible light region. In another example, the aluminum zinc oxide layer that provides the interface material can have a resistivity of about $5.62 \times 10^{-4}$ Ω·cm with a 90% transparency In some embodiments, the thickness of the zinc oxide interface layer 60 may range from 2 nm to 50 nm. In other examples, the thickness of the zinc oxide interface layer 60 may range from 5 nm to 10 nm. The zinc oxide interface layer 60 is a continuous layer having a conformal thickness that is present at the entirety of the interface between the photovoltaic device 10 and the LED 15.

The zinc oxide interface layer that is depicted in FIG. 1 is typically formed using metal organic chemical vapor deposition (MOCVD) or molecular beam epitaxial (MBE) growth.

As will be described in further detail below, the zinc oxide interface may function as a cap material obstructing the diffusion of elements, such as hydrogen, into the underlying semiconductor material layer, such as gallium including semiconductor layers, e.g., gallium nitride, aluminum gallium nitride, indium aluminum gallium nitride and combinations thereof.

The LED device 15 may include a p-type gallium nitride containing layer 12 that is in direct contact with a first end of a multi quantum well 13, and an n-type gallium nitride containing layer 14 that is direct contact with an opposing second end of the multi quantum well 13. The p-type gallium nitride containing layer 12 of the LED device 15 may be referred to as a first cladding layer, and the n-type gallium nitride containing layer 14 may be referred to as a second cladding layer.

In some embodiments, the first and second cladding layers, i.e., the p-type gallium nitride containing layer 12 and the n-type gallium nitride containing layer 14 of the LED 15, function to pump charge carriers, i.e., electron and hole charge carriers, into the intrinsic active area provided by the quantum well 13 of the LED 15. The dopant that provides the conductivity type, i.e., whether the gallium nitride containing layer 12, 14 is n-type or p-type, may be present in a concentration ranging from $10^{17}$ atoms/cm$^3$ to $10^{20}$ atoms/cm$^3$. In some examples, the p-type gallium nitride containing layer 12 and the n-type gallium nitride containing layer 14 may have a thickness ranging from 100 nm to 2000 nm. It is noted that the above compositions and thicknesses are provided for illustrative purposes only, and are not intended to limit the present disclosure.

The active region of the LED device 15 is in the intrinsic (I) region, which is within the quantum well 13. By "intrinsic" it is meant that the region is not doped with an extrinsic dopant, e.g., n-type or p-type dopant, such as the dopants used to dope the first and second cladding layers, i.e., the p-type gallium nitride containing layer 12 and the n-type gallium nitride containing layer 14. The active region in the quantum well structure is formed by alternating layers of relatively low bandgap material and layers of relatively high bandgap material. As used herein, a "low bandgap" is a bandgap ranges from 0.5 eV to 3.0 eV, and a "high bandgap" ranges from 3.1 eV to 3.5 eV. The former layers are termed "well layers" and the latter layers are termed "barrier layers." For example, for the quantum well 13, e.g., multi-quantum well, the material layers providing the relatively high bandgap material may be gallium nitride (GaN), and the material layers having the relatively low bandgap material may be indium gallium nitride (InGaN). Indium gallium nitride (InGaN) has a band gap of approximately 2.7 eV, while gallium nitride (GaN) has a band gap of approximately 3.4 eV. The band gap of approximately 2.7 eV for the indium gallium nitride (InGaN) portion of the multi-quantum well 13 can provide the minimum value for the second set of bandgap materials for the LED 15 that is less than the minimum value, i.e., is narrower than, the minimum bandgap of the wider bandgap materials for the overlying first set of bandgap materials for the material layers of the photovoltaic device 10.

To provide the stacked structure of quantum wells, the thickness of each layer of semiconductor material within the quantum well may be no greater than 50 nm. For example, the thickness for each layer of the III-V compound semiconductor material, e.g., high band gap GaN and/or low band gap InGaN, within the quantum well 13 may range from 5 nm to 10 nm. In some embodiments, the stacked structure of quantum wells may be composed of 1 to 100 layers of semiconductor material, such as III-V compound semiconductor materials, e.g., the high band gap GaN and/or low band gap InGaN. In yet another embodiment, the stacked structure of quantum wells 13 may be composed of 1 to 5 layers of semiconductor material layers.

The active region consisting of one or more indium gallium nitride (InGaN) including quantum wells 13 sandwiched between thicker layers of gallium nitride (GaN), i.e., cladding layers 12, 14, may provide an LED 15 that provides for blue light emission. For example, the LED device 15 that is depicted in FIG. 1 may emit light having a wavelength of approximately 450 nm. The wavelength of light being emitted by the LED 15 is not absorbed by the photovoltaic device 10 that the light from the LED 15 is being passed through. In some embodiments, by varying the relative In/Ga fraction in the InGaN including quantum wells 13, the light emission can in theory be varied from violet to amber. It is noted that the wavelength of approximately 450 nm is only one example of a light wavelength that may be emitted by the LED 15. In some other examples, the light wavelength that may be emitted by an LED 15 similar to that depicted in FIG. 1 may be equal to 400 nm, 410 nm, 420 nm, 430 nm, 440 nm, 450 nm, 460 nm, 470 nm, 480 nm, 490 nm and 500 nm, as well as any range of values having a lower limit selected from the aforementioned examples, and an upper limit selected from the aforementioned examples, e.g., a range extending from 430 nm to 470 nm. As noted above, the LED 15 may be powered by the voltage produced by the photovoltaic device 10, e.g., a voltage of greater than 2.0 V. In some embodiments, the LED 15 may be powered by the voltage produced by the photovoltaic device 10, e.g., a voltage greater than 2.5 V.

The LED 15 may be positioned on semiconductor substrate 5. Typically, the semiconductor substrate 5 is composed of an n-type III-V semiconductor material, such as gallium nitride, e.g., n-type GaN.

The high voltage GaN photovoltaic cells that are integrated with InGaN LED structures that are depicted in FIG. 1 may also include a glass substrate 4 on the light receiving end of the device.

Contacts 21, 22, 31, 32 may be formed to each of the photovoltaic device 10 and the LED 15. For example, a first LED device contact 21 may be in electrical communication with the n-type gallium nitride (GaN) layer that provides a cladding layer of the LED 15 on a first side of the quantum well 13 of the device, and a second LED device contact 22 may be in electrical communication with the p-type gallium nitride (GaN) layer on the opposing side of the quantum well 13 of the device. A first photovoltaic device contact 31 may be formed on the n-type gallium nitride (GaN) layer 9 of the photovoltaic device 10; and a second photovoltaic device contact 32 may be formed on the p-type gallium nitride layer (GaN) layer of the photovoltaic device 10. Each of the contacts 21, 22, 31, 32 may be composed of an electrically conductive material, such as a metal, e.g., copper, tungsten, aluminum, tantalum, silver, platinum, gold and combinations and alloys thereof.

Figure 2:
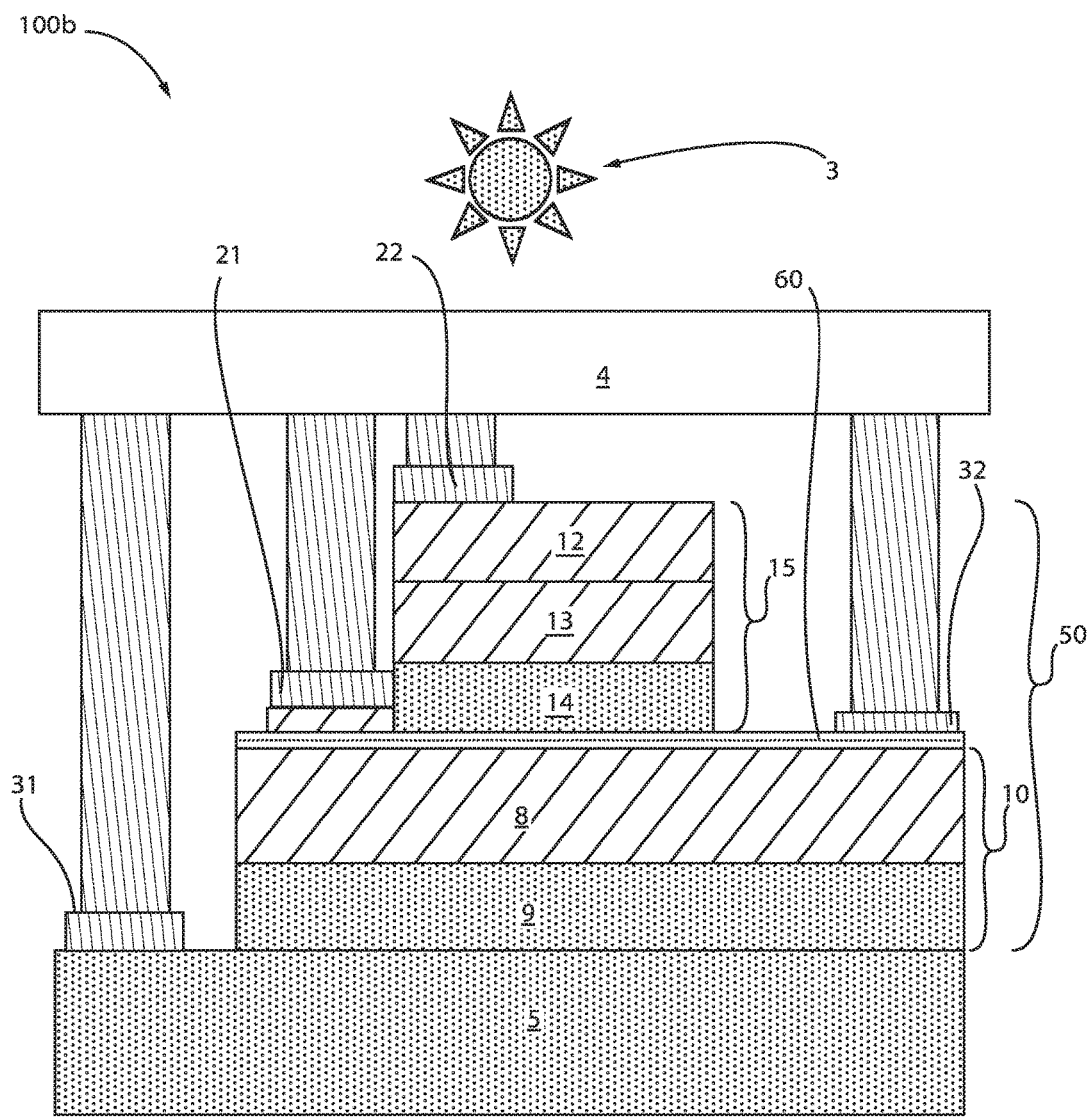
FIG. 2 is a side cross-sectional view depicting one embodiment of a high voltage photovoltaic cell including gallium nitride (GaN) that is integrated with a light emitting diode (LED), in which the photovoltaic device is positioned between the supporting substrate and the LED, and a zinc oxide interface layer is present between the LED and the photovoltaic device.

FIG. 2 depicts another embodiment of an electrical device 100b including a high voltage photovoltaic device 10 of gallium nitride (GaN) material layers that is integrated with a light emitting diode (LED) 15, in which the photovoltaic device 10 is positioned between the supporting substrate 5 and the LED 15, and the LED 15 is separated from the photovoltaic device 10 by the zinc oxide interface layer 60. The high voltage photovoltaic device 10 includes an n-type gallium nitride containing photovoltaic junction layer 9, and a p-type gallium nitride containing photovoltaic junction layer 8. The n-type gallium nitride containing photovoltaic junction layer 9, and a p-type gallium nitride containing photovoltaic junction layer 8 that are depicted in FIG. 2 are similar to the n-type gallium nitride containing photovoltaic junction layer 9, and the p-type gallium nitride containing photovoltaic junction layer 8 that are depicted in FIG. 1. Therefore, the above description of the n-type gallium nitride containing photovoltaic junction layer 9, and the p-type gallium nitride containing photovoltaic junction layer 8 that are depicted in FIG. 1 is suitable for describing the n-type gallium nitride containing photovoltaic junction layer 9, and a p-type gallium nitride containing photovoltaic junction layer 8 that are depicted in FIG. 2.

In the embodiment that is depicted in FIG. 2, the photovoltaic device 10 is present atop the supporting substrate, and the LED 15 is present atop the photovoltaic device 10, but separated from the photovoltaic device by the zinc oxide interface layer 60. The LED 15 is at the end of the material stack 50 that is the light receiving end of the device. In the embodiment depicted in FIG. 2, the photovoltaic device 10 is present between the supporting substrate 5 and the LED device 15.

The zinc oxide interface layer 60 that are depicted in FIG. 2 is similar to the zinc oxide interface layer 60 that is depicted in FIG. 1. Therefore, the above description of the zinc oxide interface layer 60 that is depicted in FIG. 1 is suitable for describing the zinc oxide interface layer 60 that is depicted in FIG. 2. For example, the zinc oxide interface layer 60 may be composed of aluminum doped zinc oxide (Al:ZnO). The zinc oxide interface layer that is depicted in FIG. 2 is typically formed using metal organic chemical vapor deposition (MOCVD) or molecular beam epitaxial (MBE) growth.

Referring to FIG. 2, the LED device 15 includes a p-type gallium nitride containing layer 12, a quantum well 13 composed of gallium nitride containing layers and indium gallium nitride containing layers, and an n-type gallium nitride containing layer 14. The p-type gallium nitride containing layer 12 and the n-type gallium nitride containing layer 14 may be referred to as cladding layers, and can function to pump charge carriers, i.e., electron and hole charge carriers, into the intrinsic active area provided by the quantum well 13. The p-type gallium nitride containing layer 12, the quantum well 13, and the n-type gallium nitride containing layer 14 that are depicted in FIG. 2 are similar to the p-type gallium nitride containing layer 12, the quantum well 13, and the n-type gallium nitride containing layer 14 that are depicted in FIG. 1. Therefore, the above description of the p-type gallium nitride containing layer 12, the quantum well 13, and the n-type gallium nitride containing layer 14 for the LED device 15 that is depicted in FIG. 1 is suitable for describing the p-type gallium nitride containing layer 12, the quantum well 13, and the n-type gallium nitride containing layer 14 of the LED device 15 that is depicted in FIG. 2.

Similar to the electrical device 100a including high voltage GaN photovoltaic device 10 integrated with an InGaN LED device 15 that is depicted in FIG. 1, the electrical device 100b including the high voltage GaN photovoltaic device 10 integrated with the InGaN including LED 15 that is depicted in FIG. 2 includes a photovoltaic device 10 that produces power greater than 2.0 V, e.g., 2.5 V or greater power, that is suitable for powering the LED 15. The photovoltaic device 10 may produce the aforementioned levels of power by being subjected to a light source 3 on the order of 300 nm. In response to the voltage, i.e., power, produced by the photovoltaic device 10, the electrically connected LED 15 can emit light having a wavelength on the order of 400 nm or greater, e.g., on the order of approximately 450 nm.

The electrical device 100b depicted in FIG. 2 also includes a supporting substrate 5, a glass substrate 4, and contacts 21, 22, 31, 32. These structures have been described above by the description of the structures having same reference numbers that are depicted in FIG. 1.

Figure 3:
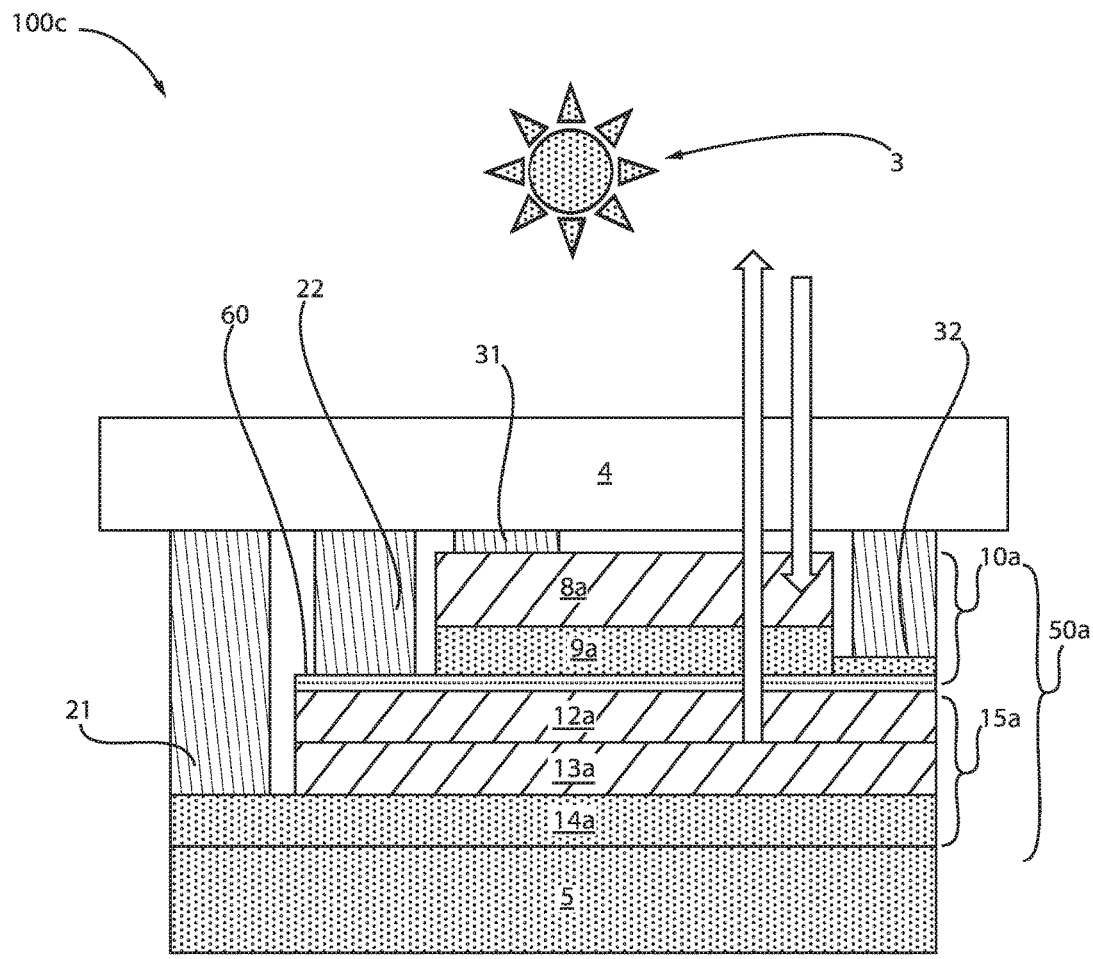
FIG. 3 is a side cross-sectional view depicting one embodiment of a high voltage photovoltaic cell including aluminum gallium nitride (AlGaN) that is integrated with a light emitting diode (LED), in which the LED is positioned between the supporting substrate and the photovoltaic device, and a zinc oxide interface layer is present between the LED and the photovoltaic device.

FIG. 3 depicts one embodiment of a high voltage photovoltaic device 10a including material layers of aluminum gallium nitride (AlGaN) that is integrated with a light emitting diode (LED) device 15a, in which the LED device 15a is positioned between the supporting substrate 5 and the photovoltaic device 10a, and the LED 15a is separated from the photovoltaic device 10a by a zinc oxide interface layer 60 that is positioned therebetween. The LED 15a may be present at a first end of the material stack 50a having a first set of bandgap materials 12a, 13a, 14a; and the photovoltaic device 10a at a second end of the material stack having a second set of bandgap materials 8a, 9a. In some embodiments, because the LED device 15a, the zinc oxide interface layer 60, and the photovoltaic device 10a are included within the same material stack 50a, the devices 10a, 15a are monolithographically integrated onto the same supporting substrate 5.

In each of the combinations of electrical devices described herein, the material layers for the photovoltaic device 10a are selected to produce enough power to cause the LED 15a to emit light. In the embodiments, in which the photovoltaic device 10a is present atop the LED 15a, and the LED 15a emits light in the direction through the photovoltaic device 10a, the bandgap materials of the photovoltaic device 10a and the LED 15a are selected so that the wavelengths of light emitted by the LED 15a are not absorbed by the photovoltaic device 10a.

In each of the electrical devices described herein, in which the photovoltaic device 10a and the LED device 15a are integrated within the same material stack 50a of semiconductor materials, the bandgaps of the materials are selected so that the device having the wider bandgap materials, e.g., LED 15a or photovoltaic device 10a, is present at the top of the device, i.e., the light receiving end of the device; and that the device having the narrower bandgap materials, e.g., LED 15a or the photovoltaic device 10a, is present at the base of the device, i.e., the end of the device that is furthest from the light source.

In the embodiment depicted in FIG. 3, the photovoltaic device 10a is present at the end of the material stack 50a that is closest to the light source 3 and is composed of a p-type conductivity aluminum, gallium and nitride containing layer 8a, i.e., p-type aluminum gallium nitride (AlGaN), that forms a junction by direct contact to an n-type conductivity aluminum, gallium and nitride containing layer 9a, i.e., n-type aluminum gallium nitride (AlGaN). The band gap for aluminum gallium nitride (AlGaN) is on the order of 4 eV. The photovoltaic device 10a that is depicted in FIG. 3 when receiving a light wavelength ranging from 200 nm to 300 nm can provide a voltage that is greater than 2.5 V. In yet other examples, the voltage provided is greater than 3.0 V. For example, the photovoltaic device 10a that is depicted in FIG. 3 that is composed of a junction of n-type and p-type aluminum gallium nitride (AlGaN) layers may provide a voltage of 3.5 V or greater. It is noted that the prior examples are provided for illustrative purposes only, and are not intended to limit the present disclosure. In other examples, the voltage provided by a photovoltaic device 10a composed of a junction of n-type and p-type conductivity aluminum gallium nitride (AlGaN), as depicted in FIG. 3, may be equal to 2.5 V, 2.75 V, 3.0 V, 3.25 V and 3.5V, as well as any value between the aforementioned examples, and any range of voltages having a lower limit provided by one of the aforementioned examples, and an upper limit provided by one of the aforementioned examples.

Each of the p-type conductivity aluminum, gallium and nitrogen containing layer 8a, i.e., p-type aluminum, gallium nitride (AlGaN), and the n-type conductivity aluminum, gallium and nitrogen containing layer 9a, i.e., n-type aluminum gallium nitride (AlGaN) may have a thickness ranging from 100 nm to 2000 nm. The dopant that provides the p-type conductivity of the n-type conductivity aluminum, gallium and nitride containing layer 8a may be present in a concentration ranging from $10^{17}$ atoms/cm$^3$ to $10^{20}$ atoms/cm$^3$. The dopant that provides the n-type conductivity of the n-type conductivity aluminum, gallium and nitride containing layer 9a may be present in a concentration ranging from $10^{17}$ atoms/cm$^3$ to $10^{20}$ atoms/cm$^3$.

In some embodiments, the light required to power the photovoltaic device 10a of the p-type conductivity aluminum, gallium and nitride containing layer 8a and the n-type conductivity aluminum, gallium and nitride containing layer 9a may range from 200 nm to 325 nm. For example, the light required to power the photovoltaic device 10a having the junction of p-type AlGaN and n-type AlGaN is equal to approximately 250 nm.

The p-type conductivity aluminum, gallium and nitride containing layer 8a and the n-type conductivity aluminum, gallium and nitride containing layer 9a of the photovoltaic device 10a provide a first set of bandgap materials, while the material layers in the LED 15a provide a second set of bandgap materials. The minimum bandgap for the first set of bandgap materials, i.e., the minimum bandgap materials for the material layers in the photovoltaic device 10a, is wider than the minimum bandgap for the second set of bandgap materials, i.e., the minimum bandgap materials for the material layers in the LED 15a.

The photovoltaic device 10a that is depicted in FIG. 3 is separated from the LED 15a by the zinc oxide interface layer 60 that is positioned therebetween. The zinc oxide interface layer 60 that is depicted in FIG. 3 is similar to the zinc oxide interface layer 60 that is depicted in FIG. 1. Therefore, the above description of the zinc oxide interface layer 60 that is depicted in FIG. 1 is suitable for describing the zinc oxide interface layer 60 that is depicted in FIG. 3. For example, the zinc oxide interface layer 60 may be composed of aluminum doped zinc oxide (Al:ZnO). The zinc oxide interface layer that is depicted in FIG. 3 is typically formed using metal organic chemical vapor deposition (MOCVD) or molecular beam epitaxial (MBE) growth.

Referring to FIG. 3, the second end of the material stack 50a includes the light emitting diode (LED) 15a. In the embodiment that is depicted in FIG. 3, the LED 15a is positioned between the supporting substrate 5 and the photovoltaic device 10a, wherein the supporting substrate 5 is comprised of n-type aluminum gallium nitride (n-type AlGaN).

The LED device 15a may include a p-type aluminum gallium nitride containing layer 12a that is in direct contact with a first end of a multi quantum well 13a, and an n-type aluminum gallium nitride containing layer 14a that is direct contact with an opposing second end of the multi quantum well 13a. The p-type aluminum gallium nitride containing layer 12a of the LED 15a may be referred to as a first cladding layer, and the n-type gallium nitride containing layer 14a may be referred to as a second cladding layer.

In some embodiments, the first and second cladding layers, i.e., the p-type aluminum gallium nitride containing layer 12a and the n-type aluminum gallium nitride containing layer 14a, function to pump charge carriers, i.e., electron and hole charge carriers, into the intrinsic active area provided by the quantum well 13a. The dopant that provides the conductivity type, i.e., whether the aluminum gallium nitride containing layer 12a, 14a is n-type or p-type, may be present in a concentration ranging from $10^{17}$ atoms/cm$^3$ to $10^{20}$ atoms/cm$^3$. In some examples, the p-type aluminum gallium nitride containing layer 12a and the n-type aluminum gallium nitride containing layer 14a may have a thickness ranging from 100 nm to 2000 nm. It is noted that the above compositions and thicknesses are provided for illustrative purposes only, and are not intended to limit the present disclosure.

The active region of the LED 15a is in the intrinsic (I) region, which is present in the quantum well 13a. The active region in the quantum well structure is formed by alternating layers of relatively low bandgap material and layers of relatively high bandgap material. As used herein, a "low bandgap" is a bandgap ranges from 0.5 eV to 3.75 eV, and a "high bandgap" ranges from 3.8 eV to 4.5 eV. The former layers are termed "well layers" and the latter layers are termed "barrier layers." For example, for the quantum well 13a, e.g., multi-quantum well, the material layers providing the relatively high bandgap material may be aluminum gallium nitride (AlGaN) having a bandgap of approximately 4 eV, and the material layers having the relatively low bandgap material may be gallium nitride (GaN) having a bandgap of approximately 3.4 eV. The band gap of approximately 3.4 eV for the gallium nitride (GaN) portion of the multi-quantum well provides that the minimum value for the second set of bandgap materials for the material layers in the LED 15a is less than the minimum value, i.e., is narrower, than the minimum bandgap of the wider bandgap materials for the overlying first set of bandgap materials for the material layers in the photovoltaic device 10 provided by aluminum gallium nitride (AlGaN) having a band gap of 4.0 eV.

To provide the stacked structure of quantum wells, the thickness of each layer of semiconductor material within the quantum well may be no greater than 50 nm. For example, the thickness for each layer of the III-V compound semiconductor material, e.g., high band gap AlGaN and/or low band gap GaN, within the quantum well 13a may range from 5 nm to 10 nm. In some embodiments, the stacked structure of quantum wells may be composed of 1 to 100 layers of semiconductor material, such as III-V compound semiconductor materials, e.g., the high band gap AlGaN and/or low band gap GaN. In yet another embodiment, the stacked structure of quantum wells may be composed of 1 to 5 layers of semiconductor material layers.

The active region consisting of one or more gallium nitride (GaN) and aluminum gallium nitride (AlGaN) including quantum wells 13a sandwiched between thicker layers of n-type and p-type doped aluminum gallium nitride (AlGaN) layers 12a, 14a, i.e., cladding layers 12a, 14a, may provide an LED 15a that provides for ultra violet (UV) light emission, i.e., light emission at wavelengths of 400 nm or less. For example, the LED device 15a that is depicted in FIG. 3 may emit light having a wavelength of approximately 350 nm. The wavelength of light being emitted by the LED device 15a is not absorbed by the photovoltaic device 10a that the light from the LED device 15a is being passed through. It is noted that the wavelength of approximately 350 nm is only one example of a light wavelength that may be emitted by the LED device 15a. In some other examples, the light wavelength that may be emitted by an LED device 15a similar to that depicted in FIG. 3 may be equal to 300 nm, 310 nm, 320 nm, 330 nm, 340 nm, 350 nm, 360 nm, 370 nm, 380 nm, 390 nm and 400 nm, as well as any range of values having a lower limit selected from the aforementioned examples, and an upper limit selected from the aforementioned examples, e.g., a range extending from 330 nm to 370 nm. As noted above, the LED device 15a may be powered by the voltage produced by the photovoltaic device 10a, e.g., a voltage of greater than 2.5 V. In some embodiments, the LED device 15a may be powered by the voltage produced by the photovoltaic device 10a, e.g., a voltage greater than 3.0 V.

The LED device 15a may be positioned on semiconductor substrate 5. Typically, the semiconductor substrate 5 is composed of an n-type III-V semiconductor material, such as aluminum gallium nitride, e.g., n-type AlGaN.

The high voltage GaN photovoltaic cells that are integrated with InGaN LED structures that are depicted in FIG. 3 may also include a glass substrate 4 on the light 3 receiving end of the device.

The electrical device 100c depicted in FIG. 3 also includes contacts 21, 22, 31, 32. These structures have been described above by the description of the structures having same reference numbers that are depicted in FIG. 1.

Figure 4:
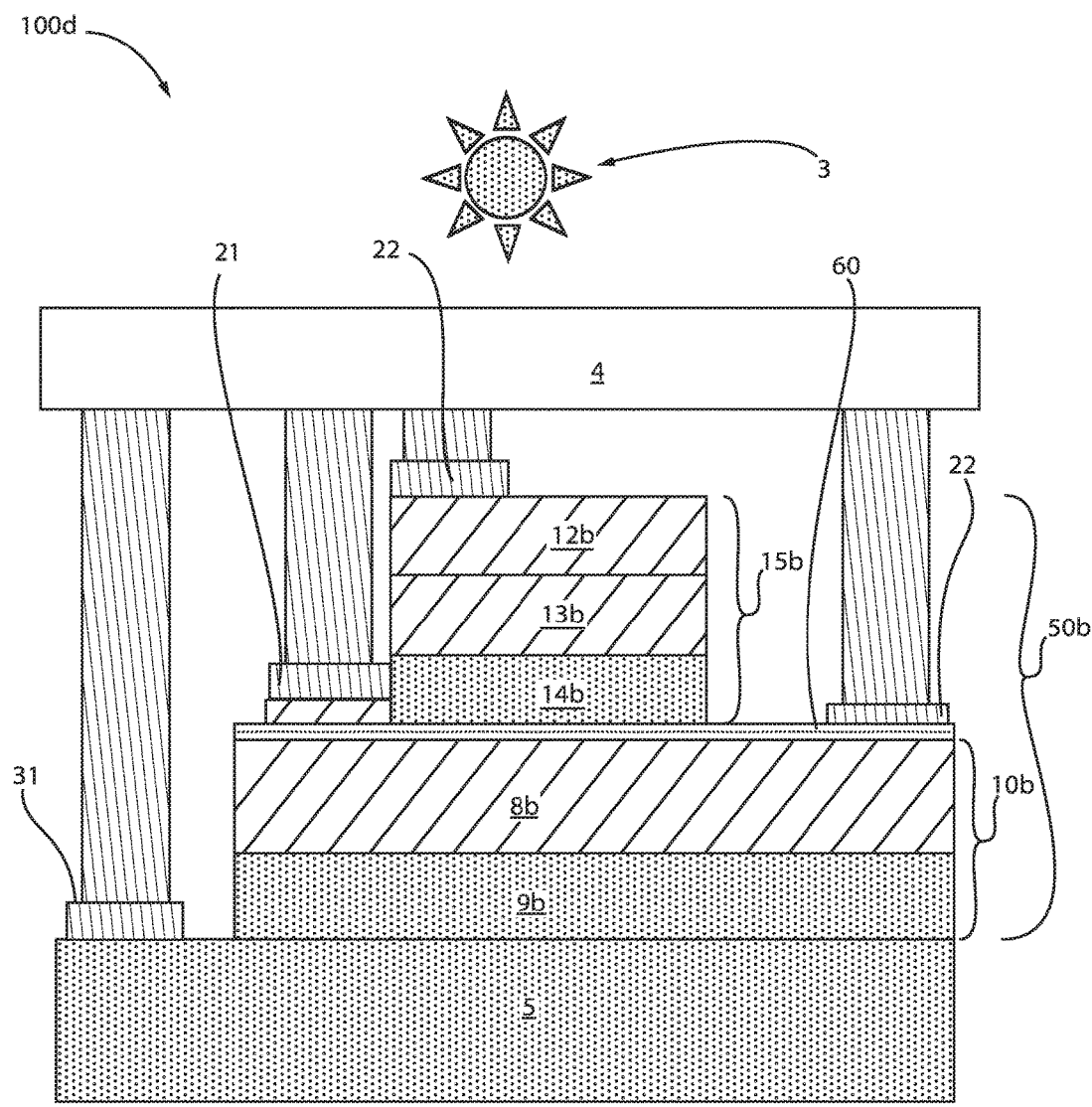
FIG. 4 is a side cross-sectional view depicting one embodiment of a high voltage photovoltaic cell including aluminum gallium nitride (GaN) that is integrated with a light emitting diode (LED), in which the photovoltaic device is positioned between the supporting substrate and the LED, and a zinc oxide interface layer is present between the LED and the photovoltaic device.

FIG. 4 depicts another embodiment of an electrical device 100d including a high voltage photovoltaic device 10b of gallium nitride (GaN) material layers that is integrated with a light emitting diode (LED) 15, in which the photovoltaic device 10b is positioned between the supporting substrate 5 and the LED 15b, and the photovoltaic device 10b is separated from the LED 15b by a zinc oxide interface layer 60. The high voltage photovoltaic device 10b includes an n-type gallium nitride containing photovoltaic junction layer 9b, and a p-type gallium nitride containing photovoltaic junction layer 8b. The n-type gallium nitride containing photovoltaic junction layer 9b, and a p-type gallium nitride containing photovoltaic junction layer 8b that are depicted in FIG. 4 are similar to the type gallium nitride containing photovoltaic junction layer 9, and a p-type gallium nitride containing photovoltaic junction layer 8 that are depicted in FIG. 1. Therefore, the above description of the n-type gallium nitride containing photovoltaic junction layer 9, and the p-type gallium nitride containing photovoltaic junction layer 8 that are depicted in FIG. 1 is suitable for describing the n-type gallium nitride containing photovoltaic junction layer 9b, and a p-type gallium nitride containing photovoltaic junction layer 8b that are depicted in FIG. 4.

In the embodiment that is depicted in FIG. 4, the LED 15b is present atop the supporting substrate 5, and the photovoltaic device 10b is present atop the LED 15b, wherein the LED 15b is at the end of the material stack 50 that is the light receiving end of the device. In the embodiment depicted in FIG. 4, the LED 15b is present between the supporting substrate 5 and the photovoltaic device 10b.

The photovoltaic device 10b that is depicted in FIG. 4 is separated from the LED 15b by the zinc oxide interface layer 60 that is positioned therebetween. The zinc oxide interface layer 60 that is depicted in FIG. 4 is similar to the zinc oxide interface layer 60 that is depicted in FIG. 1. Therefore, the above description of the zinc oxide interface layer 60 that is depicted in FIG. 1 is suitable for describing the zinc oxide interface layer 60 that is depicted in FIG. 4. For example, the zinc oxide interface layer 60 may be composed of aluminum doped zinc oxide (Al:ZnO). The zinc oxide interface layer that is depicted in FIG. 4 is typically formed using metal organic chemical vapor deposition (MOCVD) or molecular beam epitaxial (MBE) growth.

The LED 15b includes a p-type aluminum gallium nitride containing layer 12b, a quantum well 13b composed of aluminum gallium nitride containing layers and indium gallium nitride containing layers, and a n-type aluminum gallium nitride containing layer 14b.

The p-type aluminum gallium nitride containing layer 12b and the n-type aluminum gallium nitride containing layer 14b may be referred to as cladding layers, and can function to pump charge carriers, i.e., electron and hole charge carriers, into the intrinsic active area provided by the quantum well 13b. The p-type aluminum gallium nitride containing layer 12 and the n-type aluminum gallium nitride containing layer 14 that are depicted in FIG. 4 are similar to the p-type aluminum gallium nitride containing layer 12a, and the n-type aluminum gallium nitride containing layer 14a that are depicted in FIG. 3. Therefore, the above description of the p-type aluminum gallium nitride containing layer 12a and the n-type aluminum gallium nitride containing layer 14a for the LED device 15a that is depicted in FIG. 3 is suitable for describing the p-type aluminum gallium nitride containing layer 12b and the n-type aluminum gallium nitride containing layer 14b of the LED device 15b that is depicted in FIG. 4.

The active region of the LED device 15b is in the intrinsic (I) region, which is within the quantum well 13b. The active region in the quantum well structure is formed by alternating layers of relatively low bandgap material and layers of relatively high bandgap material. As used herein, a "low bandgap" is a bandgap ranges from 0.5 eV to 3.4 eV, and a "high bandgap" ranges from 3.5 eV to 4.5 eV. The former layers are termed "well layers" and the latter layers are termed "barrier layers." For example, for the quantum well 13b, e.g., multi-quantum well, the material layers providing the relatively high bandgap material may be aluminum gallium nitride (AlGaN), and the material layers having the relatively low bandgap material may be indium gallium nitride (InGaN). Indium gallium nitride (InGaN) has a band gap of approximately 2.7 eV, while aluminum gallium nitride (GaN) has a band gap of approximately 4.0 eV.

To provide the stacked structure of quantum wells, the thickness of each layer of semiconductor material within the quantum well may be no greater than 50 nm. In some embodiments, the stacked structure of quantum wells may be composed of 1 to 100 layers of semiconductor material. In yet another embodiment, the stacked structure of quantum wells 13b may be composed of 3 to 30 layers of semiconductor material layers.

The electrical device 100d depicted in FIG. 4 also includes a supporting substrate 5, a glass substrate 4, and contacts 21, 22, 31, 32. These structures have been described above by the description of the structures having same reference numbers that are depicted in FIG. 1.

Figure 5:
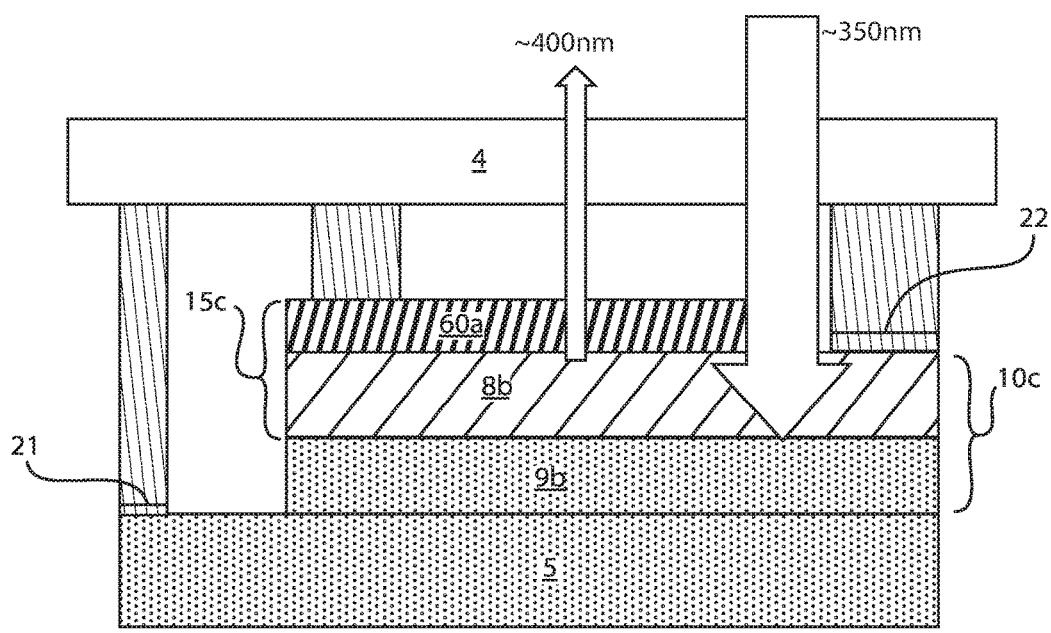
FIG. 5 is a side cross-sectional view depicting one embodiment of a high voltage photovoltaic device integrated monolithically with an LED including a zinc oxide layer, in accordance with one embodiment of the present disclosure.

FIG. 5 depicts another embodiment of a high voltage photovoltaic device 10c integrated monolithically with an LED 15c including a zinc oxide layer 60. The high voltage photovoltaic device 10c includes an n-type gallium nitride containing photovoltaic junction layer 9c and a p-type gallium nitride containing photovoltaic junction layer 8c. The n-type gallium nitride containing photovoltaic junction layer 9c, and a p-type gallium nitride containing photovoltaic junction layer 8c that are depicted in FIG. 5 are similar to the type gallium nitride containing photovoltaic junction layer 9, and a p-type gallium nitride containing photovoltaic junction layer 8 that are depicted in FIG. 1. Therefore, the above description of the n-type gallium nitride containing photovoltaic junction layer 9, and the p-type gallium nitride containing photovoltaic junction layer 8 that are depicted in FIG. 1 is suitable for describing the n-type gallium nitride containing photovoltaic junction layer 9c, and a p-type gallium nitride containing photovoltaic junction layer 8c that are depicted in FIG. 5. In FIG. 5, zinc oxide layer and the nitride hetero-junction form a LED.

The LED 15c includes the p-type gallium nitride containing photovoltaic junction layer 8c, and an n-type Zinc Oxide (N-ZnO) layer 60a. In some examples, the zinc oxide layer 60a may further include aluminum (Al). For example, the zinc oxide interface layer 60a may be composed of aluminum zinc oxide (Al:ZnO). The aluminum zinc oxide may be referred to aluminum doped zinc oxide or AZO. It is noted that aluminum is not the only metal dopant that can be employed in the zinc oxide layer 60a. Other metal dopants that are suitable for use in the zinc oxide interface layer 60 may include boron (B), gallium (Ga), indium (In), yttria (Y), fluorine (F), vanadium (V), silicon (Si), scandium (Sc), germanium Ge), titanium (Ti), zirconium (Zr), hafnium (Hf) and combinations thereof, as well as combinations with aluminum (Al).

In some embodiments, the thickness of the zinc oxide layer 60a may range from 2 nm to 50 nm. In other examples, the thickness of the zinc oxide layer 60a may range from 5 nm to 10 nm. The zinc oxide interface layer that is depicted in FIG. 5 is typically formed using metal organic chemical vapor deposition (MOCVD) or molecular beam epitaxial (MBE) growth or atomic layer deposition (ALD).

The electrical device depicted in FIG. 5 also includes a supporting substrate 5, a glass substrate 4, and contacts 21, 22, 31, 32. These structures have been described above by the description of the structures having same reference numbers that are depicted in FIG. 1.

The structures depicted in FIGS. 1-5 are now described with more detail in the following description of methods for forming high voltage photovoltaic cells that are integrated with LEDs.

Figure 6:
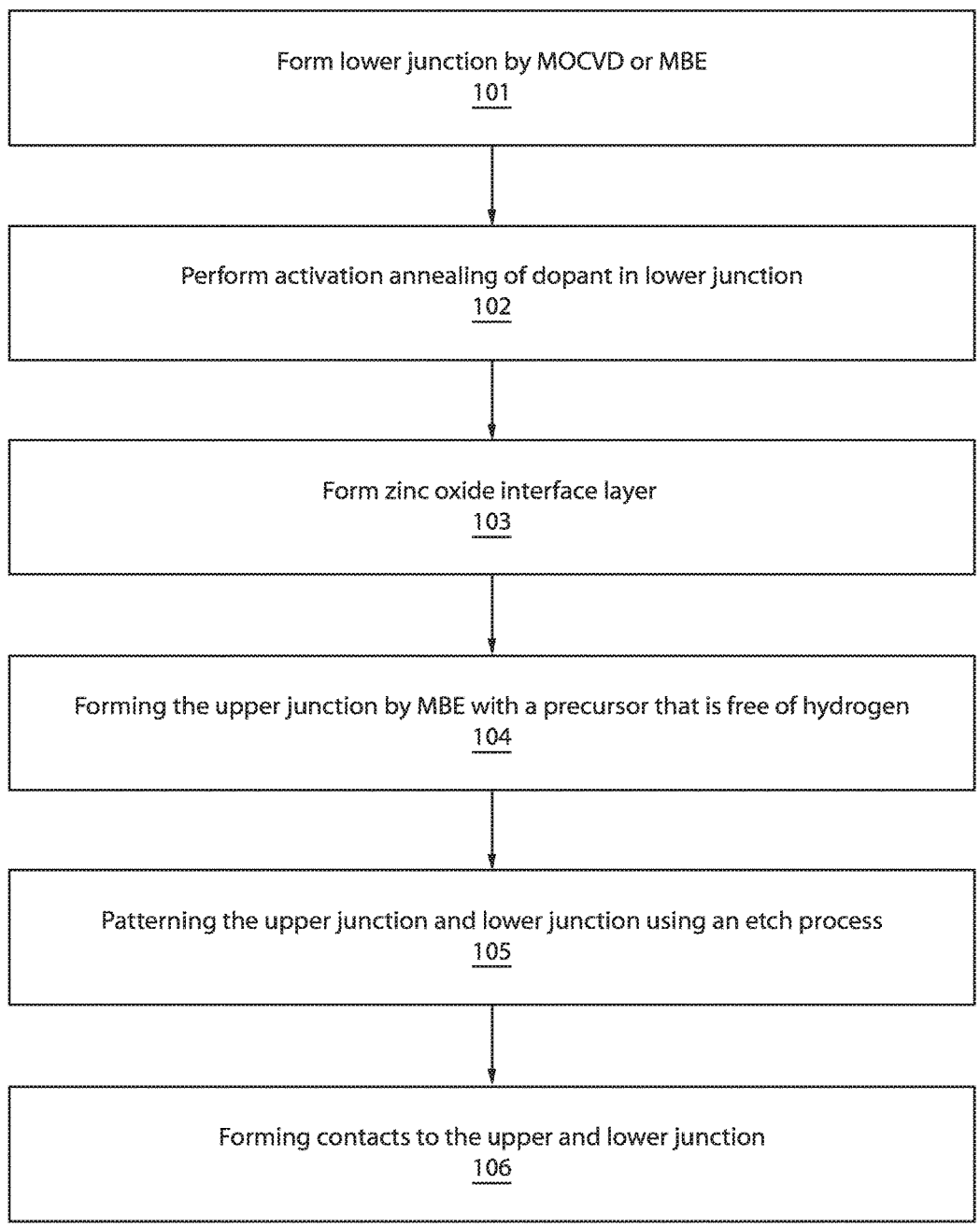
FIG. 6 is a flow chart describing one embodiment of a method for forming high voltage photovoltaics that are integrated with LEDs, and a zinc oxide interface layer is present between the LED and the photovoltaic device, in which the method includes a low hydrogen deposition process.

FIG. 6 is a flow chart illustrating one embodiment of a method for forming high voltage photovoltaics that are integrated with LEDs, such as those depicted in FIGS. 1 and 3, in which the method includes a low hydrogen deposition process. The term "low hydrogen" denotes that the deposition step has a maximum hydrogen content of $1 \times 10^{18}$ cm$^{-3}$.

The method may begin at step 101 with forming lower junction by metal organic chemical vapor deposition (MOCVD) or molecular beam epitaxy (MBE). The lower junction may be formed on a supporting substrate 5, such as an n-type gallium nitride (GaN) substrate, as depicted in FIGS. 1 and 3. The lower junction that is formed may provide an LED 15, 15a, as depicted in FIGS. 1 and 3. For example, the lower junction may provide an LED 15 depicted in FIG. 1 is composed of a p-type gallium nitride layer 12, as a first cladding layer of the LED 15; a quantum well of including gallium nitride and indium gallium nitride layers; and an n-type gallium nitride layer 14, as a second cladding layer of the LED 15. For example, the lower junction may provide an LED 15a depicted in FIG. 3 is composed of a p-type aluminum gallium nitride layer 12a, as a first cladding layer of the LED 15a; a quantum well 13a including gallium nitride and aluminum gallium nitride layers; and an n-type aluminum gallium nitride layer 14a, as a second cladding layer of the LED 15a.

The material layers of the lower junction may be formed using epitaxial growth. The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The epitaxial growth process may be by chemical vapor deposition (CVD) or molecular beam epitaxy (MBE) growth processes.

MBE growth processes can include heat the substrate, typically to some hundreds of degrees (for example, 500-600° C.) in the case of gallium nitride). In a following step, MBE growth processes include a precise beam of atoms or molecules (heated up so they're in gas form) being fired at the substrate from "guns" called effusion cells. The composition of the molecules being fired in the beams provide the composition of the deposited material layer. The molecules land on the surface of the substrate, condense, and build up systematically in ultra-thin layers, so that the material layer being grown forms one atomic layer at a time.

Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In some preferred embodiments, the CVD process used to form the lower junction may be metal organic chemical vapor deposition.

A number of different sources may be used for the deposition of epitaxial type III-V semiconductor material. In some embodiments, the sources for epitaxial growth of type III-V semiconductor material include solid sources containing In, Ga, N, P elements and combinations thereof and/or a gas precursor selected from the group consisting of trimethylgallium (TMG), trimethylindium (TMI), Trimethylaluminum (TMA), tertiary-butylphosphine (TBP), phosphine ($PH_3$), ammonia ($NH_3$), and combinations thereof. The temperature for epitaxial deposition of type III-V semiconductor materials typically ranges from 550° C. to 900° C. Although higher temperature typically results in faster deposition, the faster deposition may result in crystal defects and film cracking.

The material layers for the lower junction may be doped n-type or p-type using in situ doping. By "in-situ" it is meant that the dopant that provides the conductivity type of the material layer, e.g., material layer that contributes to providing a junction, is introduced as the material layer is being formed. To provide for in-situ doped p-type or n-type conductivity, the dopant gas may be selected from the group consisting of bis-cyclopentadienyl-magnesium ($Cp_2Mg$), silane ($SiH_4$), disilane ($Si_2H_6$), germane ($GeH_4$), carbon tetrabromide ($CBr_4$) and combinations thereof. The intrinsic materials of the quantum wells 13, 13*a* are not doped with n-type or p-type dopant.

In a following step 102, the dopants within the first junction are activated. Activation anneal may be conducted at a temperature ranging from 850° C. to 1350° C. Activation annealing may be provided by furnace annealing, rapid thermal annealing (RTA) or laser annealing.

At step 103, the method continues with forming the zinc oxide interface layer 60, 60*a* on the first junction, which may be a photovoltaic device 10, 10*a*, 10*b* or an LED 15, 15*a*, 15*b*. For the zinc oxide layer that is formed for the devices depicted in FIGS. 1, 2, 3 and 4 the zinc oxide layer 60 may be formed using molecular beam epitaxial growth (MBE) or metal organic chemical vapor deposition (MOCVD). For the zinc oxide layer for the device that is formed in FIG. 5, the zinc oxide layer 60*a* may be formed using molecular beam epitaxial growth (MBE) or metal organic chemical vapor deposition (MOCVD) or atomic layer deposition (ALD). In some embodiments, the zinc oxide interface layer 60 provides low resistance interface between the previously formed first junction and the subsequently formed second junction. In some other embodiments, the crystalline nature of the zinc oxide interface layer 60 provide an epitaxial deposition surface for the subsequently formed second junction. In yet other embodiments, the zinc oxide interface layer 60 provides a cap that protects the underlying first junction from hydrogen by acting as a diffusion barrier obstructing hydrogen from reaching the first junction. It has been determined that hydrogen can electrically deactivate p-type gallium nitride and/or p-type aluminum gallium nitride. The zinc oxide interface layer 60 substantially avoids this degradation of electrical properties.

In some embodiments, the zinc oxide interface layer 60 may be formed using atomic layer deposition. (ALD). Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed.

In some embodiments, the zinc oxide interface layer 60 may be composed of aluminum zinc oxide, or aluminum doped zinc oxide (Al:ZnO), which may be referred to as AZO. In some embodiment, the zinc oxide interface layer may be formed using a physical vapor deposition (PVD) process, such as sputtering. Typically, in sputtering processes, a target of the desired material, i.e., source, is bombarded with particles, e.g., ions, which knock atoms from the target, and the dislodged target material deposits on the deposition surface. Examples of sputtering apparatus that may be suitable for depositing the zinc oxide interface layer, e.g., Al:ZnO layer, include DC diode type systems, radio frequency (RF) sputtering, magnetron sputtering, and ionized metal plasma (IMP) sputtering.

In some examples, a highly conductive and transparent aluminum doped zinc oxide thin films can be formed by RF magnetron sputter deposition (MSP) technique using a ZnO target with $Al_2O_3$ dopant of 1-2 wt %. In other examples, zinc oxide targets doped with aluminum 1-4 wt % is sputtered with different RF or DC powers, argon flow and substrate heating at high pressure.

In other examples, a zinc oxide interface layer 60 that is composed of aluminum doped zinc oxide ($Al_2O_3$) may be formed using chemical beam deposition (CBD) at low substrate temperature.

In yet other examples, metal organic chemical vapor deposition (MOCVD) can be used to form a zinc oxide interface layer 60 that is composed of aluminum doped zinc oxide ($Al_2O_3$).

In yet even further examples, pulsed laser deposition (PLD) techniques can be used to form a zinc oxide interface layer 60 that is composed of aluminum doped zinc oxide ($Al_2O_3$). For example, PLD can deposit AZO thin films employing an ArF laser ($\lambda$=193 nm).

At step 104, the method continues by forming the upper junction using a low hydrogen deposition process, such as MBE growth methods. In the examples illustrated in FIGS. 1 and 3, the upper junction is a photovoltaic device 10, 10*a* that is epitaxially formed directly on the zinc oxide interface layer 60. In the embodiment depicted in FIG. 1, the photovoltaic device 10 may include a p-type gallium nitride (p-type GaN) layer 8 and an n-type gallium nitride (n-type GaN) layer 9. In the embodiment depicted in FIG. 3, the photovoltaic device 10*a* may include a p-type aluminum gallium nitride (p-type AlGaN) layer 8*a* and an n-type aluminum gallium nitride (n-type AlGaN) layer 9*a*.

It has been determined that hydrogen precursors can deactivate the electrically activated p-type dopant in the underlying p-type gallium nitride containing layers and/or p-type aluminum gallium containing nitride layers of the underlying LEDs 15, 15*a*. Therefore, the method for depositing the material layers of the photovoltaic devices 10*a*, 10*b* can employ a low-hydrogen containing process, e.g., deposition method using hydrogen free precursors, such as MBE. A second activation anneal may be formed after the formation of the upper junction. The activation anneal may be conducted at a temperature ranging from 850° C. to 1350° C. Activation annealing may be provided by furnace annealing, rapid thermal annealing (RTA) or laser annealing.

At step 105, the upper and lower junction may be patterned and etched to provide the geometry for each photovoltaic device 10, 10a, 10b, and each LED 15, 15a, 15b. The upper and lower junctions may be patterned using photolithography and etch processes. For example, a photoresist mask may be formed on the uppermost semiconductor layer by applying a photoresist layer, exposing the photoresist layer to a pattern of radiation, and then developing the pattern into the photoresist layer utilizing conventional resist developer. Typically, the block masks have a thickness ranging from 100 nm to 300 nm. The exposed portions of the semiconductor material layers that provide the upper and lower junctions may then be etched using an etch process, such as an anisotropic etch, e.g., reactive ion etch (RIE), or an isotropic etch, such as a wet chemical etch. In some embodiments, a first pattern and etch sequence including a first etch mask may be used to define the geometry of the upper junction; and a second pattern and etch sequence including a second etch mask may be used to define the geometry of the lower junction.

Thereafter, the contacts 21, 22, 31, 32 may be formed to each of the upper and lower junctions, i.e., photovoltaic device 10, 10a, 10b and the LED 15, 15a, 15b, using deposition, photolithography and etching processes. For example, a metal layer can be deposited using a physical vapor deposition (PVD) process. The PVD process may include plating, electroplating, electroless plating and combinations thereof. The deposited metal layers may be patterned and etched using deposition, photolithography and etching to provide the desired geometry of the contacts 21, 22, 31, 32.

Figure 7:
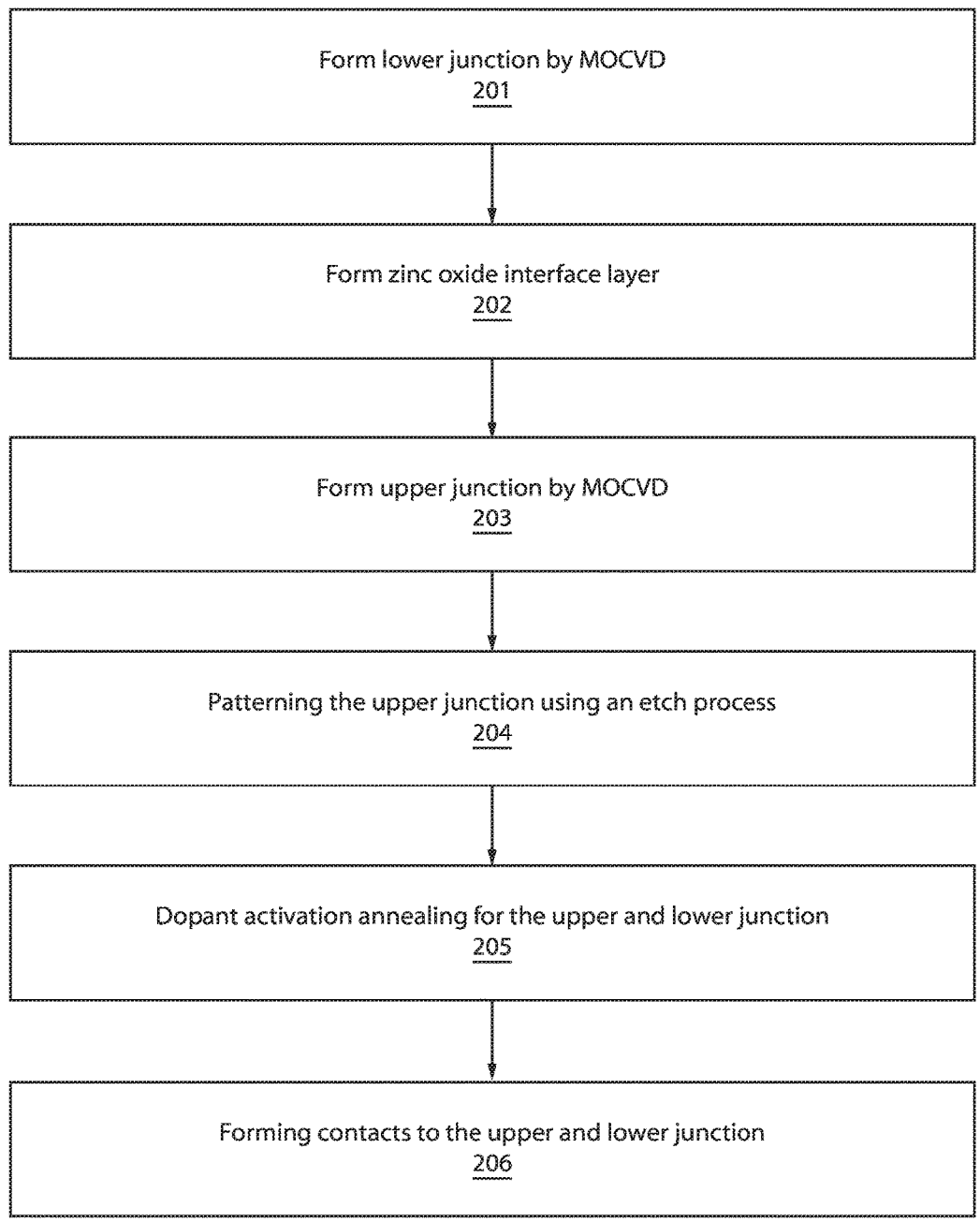
FIG. 7 is a flow chart of another embodiment of a method for forming high voltage photovoltaics that are integrated with LEDs, in which a zinc oxide interface layer is present between the LED and the photovoltaic device.

FIG. 7 is a flow chart of another embodiment of a method for forming high voltage photovoltaics that are integrated with LEDs. The process flow depicted in FIG. 7 does not require a low hydrogen forming method. At step 201 the lower junction may be epitaxially formed. In some embodiments, the lower junction may be formed using the chemical vapor deposition, e.g., MOCVD, and MBE forming methods that have been described above with reference to FIG. 6 for steps 101 and 104.

At step 202, the zinc oxide interface layer 60 may be formed on the lower junction. The zinc oxide interface layer 60 formed in step 202 is similar to the zinc oxide interface layer 60 that is described in step 103 of the method in FIG. 6. Therefore, the description of the method for forming the zinc oxide interface layer 60 provided for step 103 of the method in FIG. 6 is suitable for describing at least one embodiment of forming the zinc oxide interface layer 60 at step 202 of the method in FIG. 7. For example, the zinc oxide interface layer 60 may be aluminum doped zinc oxide (Al:ZnO) that is formed directly on the first junction.

At step 203 the upper junction may be epitaxially formed on the zinc oxide interface layer 60. In some embodiments, the upper junction may be formed using the chemical vapor deposition, e.g., MOCVD, and MBE forming methods that have been described above with reference to FIG. 6 for steps 101 and 104.

At step 204, at least the upper junction of the device is patterned to provide the geometry of the desired photovoltaic device 10, 10a, 10b and/or the LED 15, 15a, 15b. The pattern step described in step 205 is similar to the patterning step described at step 105 of the process flow describe with reference to FIG. 6. Therefore, the above described photolithography and etch steps described with reference to step 105 of FIG. 6 are applicable to an least one example of the patterning step for step 204 of the process flow illustrated in FIG. 7.

At step 205, the n-type and p-type dopants for the material layer of the upper and lower junction are activated by an activation anneal. The activation anneal at step 205 of the process flow for the method in FIG. 7 is similar to the activation anneal at step 102 of the method illustrated in FIG. 6. Therefore, the above description of the activation anneal for step 102 for the method illustrated in FIG. 6 is suitable for describing one embodiment of the activation anneal that can be used at step 205 of the method depicted in FIG. 7.

At step 206, contacts 21, 22, 31, 32 are formed to the upper and lower junctions of the device.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming an electrical device is comprising:
    growing a LED junction on a supporting substrate;
    forming a zinc oxide interface layer on the LED junction; and
    forming a photovoltaic device junction on the zinc oxide interface layer, wherein the zinc oxide interface layer entirely physically separates the LED junction from the photovoltaic device junction, the zinc oxide interface layer extending an entire width of the photovoltaic device junction.

2. The method of claim 1, wherein the zinc oxide interface layer is crystalline.

3. The method of claim 1, wherein the zinc oxide interface layer is aluminum zinc oxide.

4. The method of claim 1, wherein the zinc oxide interface layer includes boron (B), gallium (Ga), indium (In), yttria (Y), fluorine (F), vanadium (V), silicon (Si), scandium (Sc), germanium Ge), titanium (Ti), zirconium (Zr), hafnium (Hf) and combinations thereof, as well as combinations with aluminum (Al).

5. The method of claim 1, wherein the photovoltaic device junction includes an n-type gallium nitride (GaN) layer and a p-type gallium nitride (GaN) layer.

6. The method of claim 1, wherein the zinc oxide interface layer is formed by molecular beam epitaxy (MBE).

7. The method of claim 6, wherein the molecular beam epitaxial is free of hydrogen.

8. The method of claim 1, wherein the zinc oxide interface layer is formed by metal organic chemical vapor deposition (MOCVD).

9. The method of claim 1, wherein the LED device comprises a p-type gallium nitride containing layer, a quantum well composed of gallium nitride containing layers, and an n-type gallium nitride containing layer.

10. The method of claim 1, further comprising forming contacts to the LED junction and the photovoltaic device junction, wherein semiconductor material layers in the LED junction or the photovoltaic device junction that is at a light receiving end of the electrical device have a wider band gap than the LED junction or the photovoltaic device junction that is not at the light receiving end of the electrical device.

11. The method of claim 1, wherein forming the contacts comprises:
   etching the photovoltaic device junction;
   etching the LED junction; and
   forming metal electrodes to the LED and photovoltaic device junction.

12. The method of claim 1, further comprising activation annealing of the LED junction prior to forming the photovoltaic device junction.

13. A method of forming an electrical device is comprising:
   growing an LED junction on a supporting substrate, the LED junction including an n-type semiconductor layer and a p-type layer on opposing sides of a quantum well;
   forming a zinc oxide interface layer on the LED junction; and
   forming a photovoltaic device junction on the zinc oxide interface layer, wherein the zinc oxide interface layer entirely physically separates the LED junction from the photovoltaic device junction.

14. The method of claim 13, wherein the zinc oxide interface layer is crystalline.

15. The method of claim 13, wherein the zinc oxide interface layer is aluminum zinc oxide.

16. The method of claim 13, wherein the photovoltaic device junction includes an n-type gallium nitride (GaN) layer and a p-type gallium nitride (GaN) layer.

17. The method of claim 13, wherein the zinc oxide interface layer is formed by molecular beam epitaxy (MBE).

18. The method of claim 13, wherein the molecular beam epitaxial is free of hydrogen.

19. The method of claim 13, wherein the zinc oxide interface layer is formed by metal organic chemical vapor deposition (MOCVD).

20. The method of claim 13, further comprising forming contacts to the LED junction and the photovoltaic device junction, wherein semiconductor material layers in the LED junction or the photovoltaic device junction that is at a light receiving end of the electrical device have a wider band gap than the LED junction or the photovoltaic device junction that is not at the light receiving end of the electrical device.

* * * * *